United States Patent [19]
Daendliker et al.

[11] Patent Number: 5,781,334
[45] Date of Patent: Jul. 14, 1998

[54] STABILIZED MULTI-FREQUENCY LIGHT SOURCE AND METHOD OF GENERATING SYNTHETIC LIGHT WAVELENGTHS

[75] Inventors: René Daendliker, Corcelles; Rudolf Thalmann, Guemmenen, both of Switzerland

[73] Assignee: Leica AG, Heerbrugg, Switzerland

[21] Appl. No.: 793,141

[22] PCT Filed: Aug. 16, 1995

[86] PCT No.: PCT/EP95/03237

§ 371 Date: Feb. 19, 1997

§ 102(e) Date: Feb. 19, 1997

[87] PCT Pub. No.: WO96/06472

PCT Pub. Date: Feb. 29, 1996

[30] Foreign Application Priority Data

Aug. 19, 1994 [CH] Switzerland ............... 2555/94

[51] Int. Cl.$^6$ .................................................. G02F 2/02
[52] U.S. Cl. .......................... 359/326; 359/115; 359/127; 372/23
[58] Field of Search .................. 359/115, 116, 359/124–127, 180, 181, 188, 326, 331, 332; 385/15, 27; 372/9, 19, 20, 23, 26

[56] References Cited

U.S. PATENT DOCUMENTS

| | | | |
|---|---|---|---|
| 4,907,886 | 3/1990 | Dandliker | 356/349 |
| 5,347,525 | 9/1994 | Faris | 372/19 |
| 5,576,881 | 11/1996 | Doerr et al. | 359/180 X |
| 5,663,822 | 9/1997 | Fee | 359/126 X |

FOREIGN PATENT DOCUMENTS

| | | |
|---|---|---|
| 0 314 709 | 3/1992 | European Pat. Off. |
| 0 498 575 | 8/1992 | European Pat. Off. |
| 0 506 297 | 9/1992 | European Pat. Off. |
| 87/01874 | 3/1987 | WIPO |

OTHER PUBLICATIONS

G. P. Barwood et al., "Laser Diodes for Length Determination Using Swept–Frequency Interferometry", Measurement of Science and Technology, vol. 4, No. 9, Sep. (1993), pp. 988–994.

P. de Groot., "Use of a Multimode Short–External–Cavity Laser Diode for Absolute–Distance Interferometry", Applied Optics, vol. 32, No. 22, Aug. (1993), pp. 4193–4198.

R. Daendliker., "Distance Measurements with Multiple Wavelength Techniques", High Precision Navigation 91, Nov. (1991), pp. 159–170.

*Primary Examiner*—John D. Lee
*Attorney, Agent, or Firm*—Foley & Lardner

[57] ABSTRACT

The invention concerns the generation of synthetic light wavelengths in which light from a first light source ($D_1$) is coupled into a common light path section ($L_{G1}$) and its average frequency value ($v_1$) is locked with a resonant frequency ($v_1$) of the Fabry-Perot resonator (R). The light from a second light source ($D_2$) is coupled into the common light path section ($L_{G1}$) and its average frequency value ($v_2$) is set in order to reach a subsequent resonant frequency ($v_2$) of the Fabry-Perot resonator (R) and be locked therewith. A beat frequency ($\Delta v_{12}$), which is measured by electronic counters whilst a corresponding measured frequency value ($f_{12}$) is prepared, is formed between the frequencies ($v_1$, $v_2$) of the light from the two light sources ($D_1$, $D_2$). The light from at least one further light source ($D_i$) is coupled into the common light path section ($L_{G1}$) and its average frequency value ($v_i$) is first adapted to the average frequency value ($v_1$ or $v_2$) of one of the above light sources ($D_1$, $D_2$) and then altered until it reaches a pre-determined resonance of the Fabry-Perot resonator (R) and is locked therewith. the number ($k_i$) of resonances passed through being counted. The beat frequency ($\Delta v_{1i}$ or $\Delta v_{2i}$) between the frequency ($v_1$ or $v_2$) of the light from the selected light source ($D_1$ or $D_2$) and from the further light source ($D_i$) is calculated as the product ($k_i \times \Delta v_{12}$ or $k_i+1 \times \Delta v_{12}$) of the beat frequency ($\Delta v_{12}$) between the frequencies ($v_1$, $v_2$) of the light from the first and second light sources ($D_1$, $D_2$) and the number ($k_i$ or $k_i+1$) of resonances passed through.

10 Claims, 4 Drawing Sheets

STABILIZED MULTI-FREQUENCY LIGHT SOURCE AND METHOD OF GENERATING SYNTHETIC LIGHT WAVELENGTHS

The invention relates to a stabilized multi-frequency light source for generating synthetic light wavelengths, having at least three light sources for emitting coherent light, in accordance with the preamble of claim 1.

The invention also relates to a method for generating synthetic light wavelengths by means of this stabilized multi-frequency light source.

The term "light" is to be understood here as any electromagnetic radiation in the wavelength region of ultraviolet to infrared light which can be diffracted and reflected using optical elements.

A multi-frequency light source of the type mentioned at the beginning is disclosed, for example, in the article "Distance Measurements with Multiple Wavelength Techniques" by R. Dändliker in "High Precision Navigation 91, Proceedings of the 2nd Internat. Workshop on High Precision Navigation (Stuttgart & Freudenstadt, Nov. 1991)" |published by K. Linkwitz & U. Hangleiter, Ferd. D ümmlers Verlag, Bonn (1992), pages 159 to 170|. A stabilized helium-neon laser and three laser diodes are used therein as light sources. The Fabry-Perot resonator is stabilized owing to the fact that its optically active resonator length is locked by a tracking controller with the frequency of the helium-neon laser. For their part, the frequencies of the light of the three laser diodes are locked with the optically active resonator length of the Fabry-Perot resonator and thereby indirectly with the frequency of the helium-neon laser, and stabilized.

The principle of dual-frequency interferometry with an optical heterodyne method, in which a multi-frequency light source of the type mentioned at the beginning can be used, as well as exemplary embodiments thereof are disclosed, inter alia, in EP-B1-0314709 and U.S. Pat. No. 4,907,886 and are also mentioned in the abovementioned article by R. Dändliker. In dual-frequency interferometry, a beat frequency is formed from the frequencies of the light of two light sources and is equal to the difference between these two frequencies and corresponds to a synthetic light wavelength which, for its part, determines the resolution of the interferometric measurement. Typically, dual-frequency interferometry achieves a measuring accuracy of down to a few ppm for measured distances of up to a dozen meters.

Under these circumstances, it is the relative stability of the beat frequency which limits the relative measuring accuracy. To expand this limit, that is to say to improve the measurement results by increasing the relative measuring accuracy, it is necessary to improve the relative stability of the beat frequency down to one ppm or even fractions thereof. Two light sources have to be stabilized relative to one another in order to achieve this.

There is exactly the same stability problem when a multi-frequency light source with three laser diodes is used in order to generate two beat frequencies which together permit the ambiguity of the measurement with reference to phase to be eliminated.

It is known that electronic means nowadays permit the measurement of frequencies with a measuring accuracy of down to one ppm or even fractions thereof. On the other hand, electronic means do not presently permit frequencies of more than a few GHz to be measured. It is therefore not yet possible to measure optical beat frequencies of more than a few GHz with a measuring accuracy of down to one ppm or even fractions thereof.

Consequently, it is the object of the invention to make available a multi-frequency light source of the type mentioned at the beginning which, in the case of at least one synthetic light wavelength generated therein whose beat frequency is a multiple of the frequency which can be measured with the aid of electronic means, nevertheless permits the beat frequency to be measured with the measuring accuracy which can be achieved by means of electronic frequency measurement.

To achieve this object, a stabilized multi-frequency light source of the type mentioned at the beginning is defined according to the invention by the combination of features defined in claim 1. Preferred embodiments of the stabilized multi-frequency light source according to the invention are defined in the dependent claims 2 to 6.

A method for generating synthetic light wavelengths by means of this stabilized multi-frequency light source is defined according to the invention by the combination of method steps which is defined in claim 7. Preferred developments of the method according to the invention are defined in the dependent claims 8 to 10.

The stabilized multi-frequency light source according to the invention, and the method according to the invention for generating synthetic light wavelengths by means of this stabilized multi-frequency light source permit the current possibilities of electronics and, in particular, of pulse technology to be used, very particular reference being made to the current possibilities in measuring time intervals and in counting pulses in the GHz region with a measuring accuracy in the range of down to one ppm or even fractions thereof.

The lowest beat frequency which is generated according to the invention in the stabilized multi-frequency light source is in the GHz region, for example at about 1.5 GHz. This lowest beat frequency is measured electronically and is therefore, as is consequently also the frequency spacing between neighboring resonant frequencies of the resonator, known with a measuring accuracy in the range of down to one ppm or even fractions thereof. The other beat frequencies which can be locked with this lowest beat frequency are a multiple thereof as far as into the region of hundreds of GHz, and are then known, certainly indirectly but with approximately the same measuring accuracy, down to one ppm or even fractions thereof.

In brief, in the case of light with a synthetic light wavelength whose beat frequency is a multiple of the frequency which can be measured with the aid of electronic means, the multi-frequency light source according to the invention permits this beat frequency to be measured nevertheless with the measuring accuracy which can be achieved by means of electronic frequency measurement.

Design examples and exemplary embodiments of the invention are described below in more detail with reference to the drawing, in which.

Figure 1:
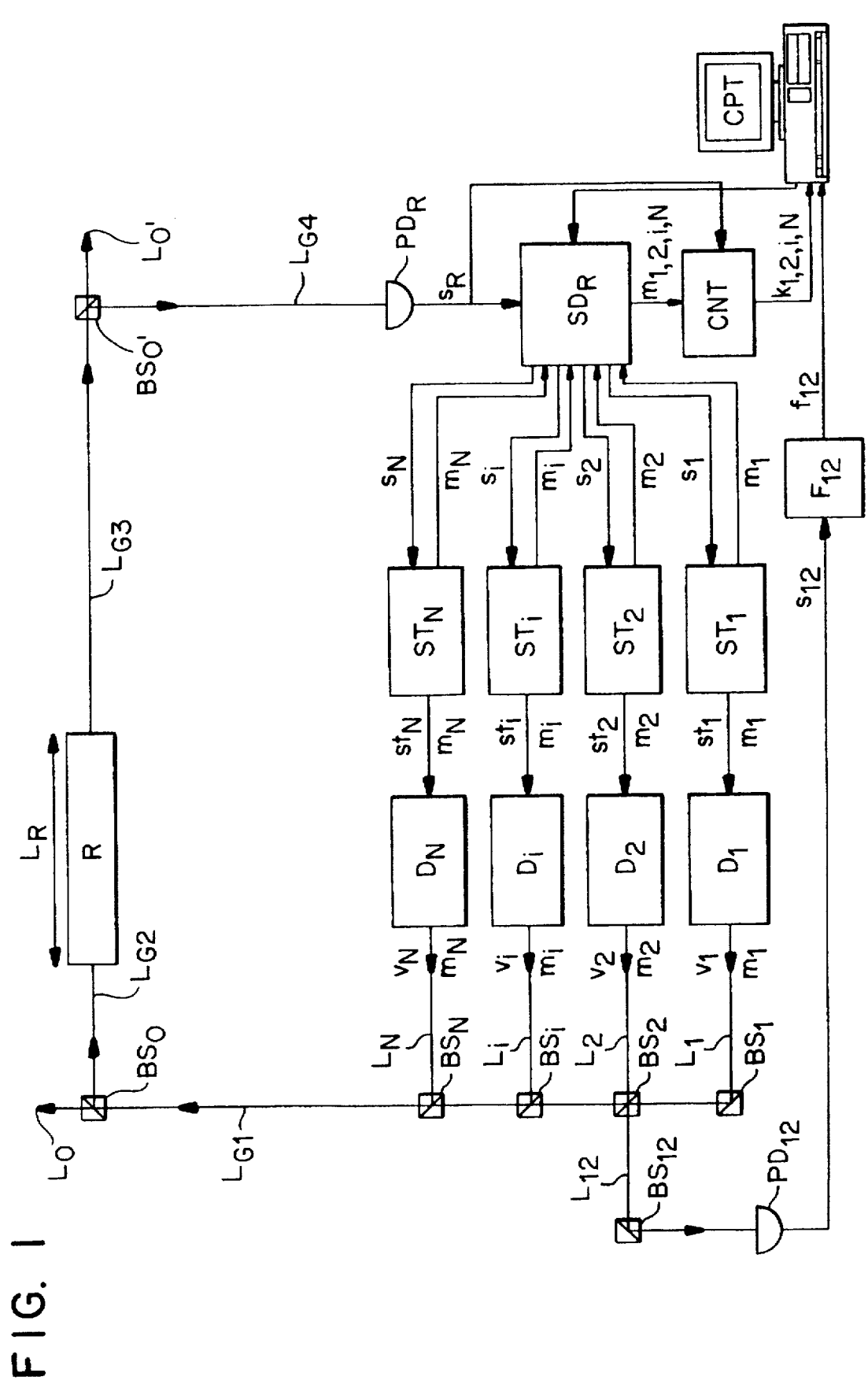
FIG. 1 shows a block diagram of a first design example of a stabilized multi-frequency light source according to the invention.

As the block diagram represented in FIG. 1 shows, the stabilized multi-frequency light source according to the invention firstly comprises a Fabry-Perot resonator R with a resonance length $L_R$, as well as a plurality of light sources, four light sources $D_1$, $D_2$ $D_i$, $D_N$ in the design example represented. In general, however, the following description is intended to relate also to an arbitrary number i of at least three light sources $D_i$ with i=1 ... N and $N \geq 3$.

Figure 2:
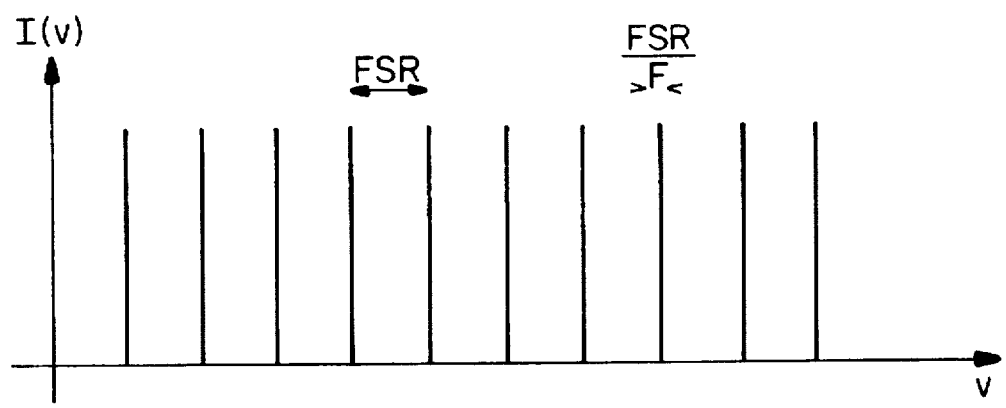
FIG. 2 shows an outline diagram of a frequency spectrum of possible resonances in a Fabry-Perot resonator.

It is a known property of a Fabry-Perot resonator that it has in the frequency range a discrete spectrum of resonances of the light on its resonance length $L_R$. In the outline diagram of FIG. 2, the transmission I(v) of a Fabry-Perot resonator is illustrated as a function of the frequency (v) of the light circulating therein. The frequency spectrum of the possible resonances appears as a regular sequence of individual resonance characteristics, which although illustrated in the diagram of FIG. 2 as bars actually have the usual bell-shaped profile. The difference between the resonant frequencies, that is to say between the frequencies of the peak values of two neighboring resonance characteristics, is termed the "free spectral range"; it is essentially constant and is illustrated by FSR in FIG. 2. The ratio between the "free spectral range" and the full half width of a resonance characteristic is termed "finesse" F (for which reason the full half width of a resonance characteristic is denoted in FIG. 2 by the fraction $^{FSR}/_F$). The finesse expresses how high the resolving power of the Fabry-Perot resonator is, and it results essentially from the design of the Fabry-Perot resonator. A Fabry-Perot resonator R for use in a stabilized multi-frequency light source according to the invention should have a finesse of at least approximately F=100. However, it is to be understood that a better finesse (F>100) is by all means advantageous, while a lower finesse can, in some circumstances, still be useful for the purposes of the invention.

The light source $D_1$ is suitable for emitting coherent light on an assigned light path $L_1$ with an assigned frequency $v_1$, which can be set and tuned as a function of an electric feed signal $st_1$ fed to the light source $D_1$. For example, the light source $D_1$ is a tunable laser diode, a tunable dye laser, a tunable solid-state laser and the like. The same also holds for the other light sources $D_2$ ... $D_i$ ... $D_N$ (with $N \geq 3$) independently of one another.

The Fabry-Perot resonator R is arranged on a light path section $L_{G1}$–$L_{G4}$ in which light from all the light sources $D_i$ circulates, and which essentially comprises the successive common light path sections $L_{G1}$, $L_{G2}$, $L_{G3}$, $L_{G4}$. Reflection of the light at the optical elements $BS_O$ and $BS_{O'}$ is insignificant in this context. Light from all the light sources $D_i$ is coupled into the common light path section $L_{G1}$–$L_{G4}$. For this purpose, a semireflecting optical element $BS_i$ which is assigned to the light source $D_i$ and whose light is coupled into the common light path section $L_{G1}$ is inserted in each case on a light path $L_i$ of the light emerging from the light source $D_i$. This semireflecting optical element $BS_i$ (BS from "beam splitter") is, for example, a half-silvered mirror or a cubic beam splitter (such semireflecting optical elements are known both to split a light beam and to combine two light beams. (lacuna)

For the rest, the Fabry-Perot resonator R is constructed and dimensioned such that its resonance length $L_R$ permits a resonance at the frequency $v_i$ of the light source $D_i$.

The already mentioned light path sections $L_{G1}$, $L_{G2}$, $L_{G3}$, $L_{G4}$ and light paths $L_i$, as well as further analogous optical elements mentioned below and even the Fabry-Perot resonator R itself can either, as is customary, be designed as links in a generally homogeneous optical medium (vacuum, gas, glass etc.) or also using light guide technology (fibers, thin films etc.). Likewise, the already mentioned semireflecting optical elements $BS_i$ and light-deflecting optical elements $BS_O$ and $BS_{O'}$, also like other analogous optical elements mentioned below can be designed either, as usual, to be of glass or or |sic| also using light guide technology (fibers etc.).

In order to lock the frequency $v_i$ of the light source $D_i$ with a resonant frequency of the Fabry-Perot resonator R, an electrooptical control circuit for the light source $D_i$ is provided which essentially comprises an optoelectronic detector $PD_R$, an electronic signal discriminator $SD_R$ and an electric controller $st_i$ assigned to the light source $D_i$.

The controller $ST_i$ is electrically connected to the assigned light source $D_i$, and it generates for this light source $D_i$ the already mentioned feed signal $st_i$, which sets the frequency $v_i$ of the light from the light source $D_i$ as a function of an electric control signal $s_i$ fed to the controller $ST_i$ and modulates this frequency $v_i$ about the mean value $\bar{v}_i$ thereof with a characteristic modulation frequency $m_i$. This characteristic modulation frequency $m_i$ is assigned to the controller $ST_i$ and thus also to the light source $D_i$.

The detector $PD_R$ is arranged on or at the end of the common light path section $L_{G4}$; it receives the light circulating therein and generates therefrom an electric detector signal $s_R$ as a function of an intensity of the received light.

The signal discriminator $SD_R$ is electrically connected to the detector $PD_R$ and the controllers $ST_i$. The signal discriminator $SD_R$ receives the detector signal $s_R$ from the detector $PD_R$. The signal discriminator $SD_R$ receives a signal carrying the modulation frequency $m_i$ from the controller $ST_i$. The signal discriminator $SD_R$ generates the already mentioned control signal $s_i$ for the controller $ST_i$ by means of synchronous demodulation of the detector signal $s_R$ with the modulation frequency $m_i$.

A tracking controller is formed in essence from the electric controller $ST_i$ corresponding to a light source $D_i$, the optoelectronic detector $PD_R$ and the signal discriminator $SD_R$, and can be used to lock the frequency $v_i$ of the light from this light source $D_i$ with a resonant frequency of the Fabry-Perot resonator R.

The same also holds, in turn, for the other light sources $D_i$ (with i=1 ... N and $N \geq 3$), as also for the respectively associated electrooptical control circuit with the optoelectronic detector $PD_R$, the electronic signal discriminator $SD_R$ and the assigned electric controller $ST_i$.

The principle of the design of the device described above corresponds to a prior art which is already known, inter alia, from the article by R. Dändliker quoted above. In particular, the measures for locking the frequency $v_i$ of the light source $D_i$ with a resonant frequency of the Fabry-Perot resonator R correspond to a prior art with which the person skilled in the art is conversant in the relevant field. It is therefore superfluous to go into more detail on the device described above. This also holds, inter alia, for the synchronous demodulation of the detector signal $s_R$ with the modulation frequency $m_i$ for generating the control signal $s_i$ for the controller $ST_i$ in the signal discriminator $SD_R$.

The device described above can be used to generate synthetic light wavelengths which respectively correspond to the beat frequency between the respective frequencies of the light from two of the light sources. The person skilled in the art is also conversant with this in the relevant field and it is already known, inter alia, from the article by R. Dandliker quoted at the beginning.

However, it is not possible using the device described above to measure the beat frequencies in the care of frequency values of more than a few GHz with the measuring accuracy which can be achieved with the aid of electronic means in the case of frequency values of up to a few GHz. This measuring accuracy can also be achieved in the case of frequency values of more than a few GHz by means of the measures now to be described.

The semireflecting optical elements $BS_i$ form a sequence with $i=1 \ldots N$ and $N \geq 3$. At the output of the last element $BS_N$, the light from all the light sources $D_i$ is combined and coupled into the common light path section $L_{G1}$–$L_{G4}$, that is to say the common light path section $L_{G1}$ essentially begins at the output of the last element $BS_N$. Only the light from the light source $D_1$ is directed and guided at the output of the first element $BS_1$ to the common light path section $L_{G1}$. The light from the two light sources $D_1$ and $D_2$ is directed and guided at the output of the second element $BS_2$ to the common light path section $L_{G1}$. The same is repeated in essence for the further elements $BS_i \ldots BS_N$.

A second semireflecting optical element $BS_2$ is now also selected for this purpose and used not only, as already mentioned, to combine the light from the two light sources $D_1$ and $D_2$, but also to couple a portion of this combined light out of the assigned light paths $L_1$ and $L_2$ and to direct it to a branching light path $L_{12}$.

A second optoelectronic detector $PD_{12}$ is arranged on this branching light path $L_{12}$. This second detector $PD_{12}$ is arranged on or at the end of the branching light path $L_{12}$; it receives the light circulating therein and generates therefrom an electric detector signal $s_{12}$ as a function of an intensity of the received light. A deflection of the light at the preceding optical element $BS_{12}$ is insignificant in this context.

Connected to the second detector $PD_{12}$ is an electronic frequency measuring device $F_{12}$ which receives the above-mentioned electric detector signal $s_{12}$ from the second detector $PD_{12}$ and generates therefrom an electric measured frequency value $f_{12}$. This measured frequency value $f_{12}$ corresponds to a beat frequency $\Delta v_{12}$ between the frequencies $v_1$ and $v_2$ of the light from the selected two light sources $D_1$ and $D_2$. This beat frequency $\Delta v_{12}$ or the measured frequency value $f_{12}$ thereof is in the GHz region, for example at approximately 1.5 GHz.

The modulation frequencies $m_1$ and $m_2$ and their beat frequency $\Delta m_{12}=(m_1-m_2)$ cause no interference here because they are of quite different, much deeper orders of magnitude than the beat frequency $\Delta v_{12}$, with the result that they are filtered out or not acquired at all by the frequency measuring device $F_{12}$.

An evaluation device CPT which is, for example, a computer (Personal Computer or the like) is electrically connected to the frequency measuring device $F_{12}$. The evaluation device CPT receives the measured frequency value $f_{12}$ from the frequency measuring device $F_{12}$, and displays said value and/or processes it further. In particular, the measured frequency value $f_{12}$ can be monitored for constancy in order to signal impermissible deviations and/or to take other measures, for example in order to correct the temperature control (not shown) of the Fabry-Perot resonator R. Likewise, the activities of the signal discriminator $SD_R$ can be initiated, controlled and monitored by the evaluation device CPT if this evaluation device CPT is a computer which is programmed for this purpose and, as shown, connected to the signal discriminator $SD_R$.

Resonances of the light from one of the light sources $D_i$ with the resonance length $L_R$ of the Fabry-Perot resonator R at the mean value $\bar{v}_i$ of the frequency $v_i$ of this light, in particular during a change in this mean value $\bar{v}_i$, are preferably determined with the aid of an electronic counting device CNT. This counting device CNT is essentially a peak-value detector for determining and counting resonances. On the one hand, the counting device CNT is connected to the detector $PD_R$ in order to receive the detector signal $s_R$ therefrom. On the other hand, the counting device CNT is electrically connected to the signal discriminator $SD_R$ in order to receive a signal carrying the modulation frequency $m_i$ therefrom. From these signals, the counting device CNT forms by means of synchronous demodulation of the detector signal $s_R$ with the respective modulation frequency $m_i$, a resulting demodulated signal whose peak values it counts in order to generate a count value of a number $k_i$ of traversed resonances. In addition, the electronic counting device CNT is also preferably electrically connected to the evaluation device CPT, in order to feed the latter the count value of the number $k_i$ of traversed resonances.

The already mentioned semireflecting optical elements $BS_O$ and $BS_{O'}$, or only one thereof, are provided optionally in order to couple light out of the common light path section $L_{G1}$–$L_{G4}$. One element $BS_O$ is arranged between the common light path sections $L_{G1}$ and $L_{G2}$, and it directs a portion of the light circulating therein to a light output $L_O$. The other element $BS_{O'}$, is arranged between the common light path sections $L_{G3}$ and $L_{G4}$, and it directs a portion of the light circulating therein to a light output $L_{O'}$. The light coupled out of the semi-reflecting optical elements $BS_O$ and/or $BS_{O'}$ succeeds in being used as light with a synthetic wavelength which corresponds to the beat frequency $\Delta v_{12}$ which, for its part, is known via the electronically measured measured frequency value $f_{12}$.

The procedure for generating this synthetic light wavelength is in accordance with the following method steps:

Firstly, the light from the first light source $D_1$ of the frequency $v_1$ is coupled into the common light path section $L_{G1}$ via the semireflecting optical element $BS_1$.

The mean value $\bar{v}_1$ of the frequency $v_1$ of the light from the first light source $D_1$ is locked with a first resonant frequency $v_1$ of the Fabry-Perot resonator R, which is accomplished by the electrooptical control circuit which essentially comprises the first named optoelectronic detector $PD_R$, the electronic signal discriminator $SD_R$ and the electric controller $ST_1$ assigned to the light source $D_1$.

Thereafter, the light from the second light source $D_2$ of the frequency $v_2$ is coupled into the common light path section $L_{G1}$ via the semireflecting optical element $BS_2$.

The mean value $\bar{v}_2$ of the frequency $v_2$ of the light from the second light source $D_2$ is set until it reaches a second resonant frequency $v_2$ of the Fabry-Perot resonator R. For example, the mean value $\bar{v}_2$ of the frequency $v_2$ of the light from the second light source $D_2$ can initially be equal to the mean value $\bar{v}_1$ of the frequency $v_1$ of the light from the first light source $D_1$, and can then be varied until after leaving the resonance (at the resonant frequency $v_1$) the next resonance (at the resonant frequency $v_2$) is reached at the Fabry-Perot resonator R and is determined at the optoelectronic detector $PD_R$, preferably with the aid of the electronic counting device CNT.

It may be freely selected in this process whether it holds that $(v_2 > v_1)$ or $(v_2 < v_1)$, that is to say the abovementioned next resonance (at the resonant frequency $v_2$) can be higher or lower than the preceding resonance (at the resonant frequency $v_1$). For example, it holds that $(v_2 > v_1)$.

Thereafter, the mean value $\bar{v}_2$ of the frequency $v_2$ of the light from the second light source $D_2$ is locked with the second resonant frequency $v_2$ of the Fabry-Perot resonator R, which is accomplished by the electrooptical control circuit, which essentially comprises the first named optoelectronic detector $PD_R$, the electronic signal discriminator $SD_R$ and the electric controller $ST_2$ assigned to the light source $D_2$.

Figure 3:
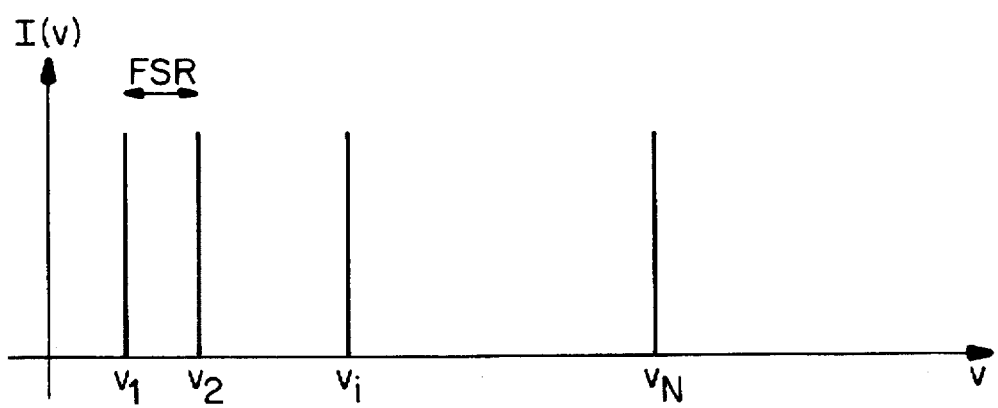
FIG. 3 shows an outline diagram of a frequency spectrum of possible resonances in a Fabry-Perot resonator in conjunction with the method according to the invention and the stabilized multi-frequency light source according to the block diagram of FIG. 1.

The two mean values $\bar{v}_1$ and $\bar{v}_2$ of the frequency $v_1$ and $v_2$, respectively, of the light from the two light sources $D_1$ and $D_2$, respectively, are thus now locked with successive neighboring resonant frequencies of the Fabry-Perot resonator R, which are shown in the outline diagram of FIG. 3 and likewise denoted there by $v_1$ and $v_2$, respectively.

The light from the two light sources $D_1$ and $D_2$, respectively, circulates in the common light path section $L_{G1}-L_{G4}$. In this arrangement, there is formed between the frequencies $v_1$ and $v_2$ of the light from the two light sources $D_1$ and $D_2$, respectively, a beat frequency $\Delta v_{12}$, which is measured with the aid of electronic counting means which essentially comprise the second detector $PD_{12}$ and the electronic frequency measuring device $F_{12}$ and generate the electric measured frequency value $f_{12}$ which, for its part, is directed to the already mentioned evaluation device CPT in order to be displayed therein or with the aid thereof and/or to be processed further. As already also mentioned, the beat frequency $\Delta v_{12}$ or the measured frequency value $f_{12}$ thereof is in the GHz region, for example at approximately 1.5 GHz.

The light $L_O$ and/or $L_{O'}$ is coupled out of the common light path section $L_{G1}-L_{G4}$ via the semireflecting optical elements $BS_O$ and/or $BS_{O'}$, thus making provision of light with a synthetic wavelength $\Lambda_{12}$ which is known via the electronically measured measured frequency value $f_{12}$ of the beat frequency $\Delta v_{12}$ corresponding to it.

In a fashion analogous to the described arrangement in conjunction with the light sources $D_1$ and $D_2$, the light from a further light source $D_i$ of frequency $v_i$ is now coupled into the common light path section $L_{G1}$ via the semireflecting optical element $BS_i$.

The mean value $\bar{v}_i$ of the frequency $v_i$ of the light from the further light source $D_i$ is firstly set equal to one of the previously mentioned mean values $\bar{v}_1$ or $\bar{v}_2$ of the frequencies $v_1$ and $v_2$, respectively, of the light from the first or second light sources $D_1$, $D_2$, which is accomplished by means of the electrooptic control circuit, which essentially comprises the first named optoelectronic detector $PD_R$, the electronic signal discriminator $SD_R$ and the electric controller $ST_i$ assigned to the light source $D_i$.

Thereafter, the mean value $\bar{v}_i$ of the frequency $v_i$ of the light from the further light source $D_i$ is gradually varied, which has the effect that resonances are sequentially traversed in the Fabry-Perot resonator R. The traversed resonances are counted in the electronic counting device CNT, and the variation of the mean value $\bar{v}_i$ is continued until a predetermined number $k_i$ of resonances of the Fabry-Perot resonator R have been traversed. When the predetermined number $k_i$ of resonances has been reached, variation of the mean value $\bar{v}_i$ is stopped, whereupon the mean value $\bar{v}_i$ of the frequency $v_i$ of the light from the further light source $D_i$ remains in coincidence with a further resonant frequency $v_i$, reached correspondingly, of the Fabry-Perot resonator R.

Thereupon, in a fashion analogous to the process with the light source [sic] $D_1$ and $D_2$, the mean value $\bar{v}_i$ of the frequency $v_i$ of the light from the further light source $D_i$ is locked with the further resonant frequency $v_i$ of the Fabry-Perot resonator R, which is accomplished by the electrooptical control circuit, which essentially comprises the first mentioned optoelectronic detector $PD_R$, the electronic signal discriminator $SD_R$ and the electric controller $ST_i$ assigned to the light source $D_i$.

It may be freely selected in this process whether it holds that $(v_i > v_1$ or $v_2)$ or $(v_i < v_1$ or $v_2)$, that is to say the abovementioned resonance reached (at the resonant frequency $v_i$) can be higher or lower than the preceding resonance (at the resonant frequency $v_1$ or $v_2$). For example, it holds that $(v_i > v_1$ or $v_2)$.

The three mean values $\bar{v}_1$ or $\bar{v}_2$ or $\bar{v}_i$ of the frequency $v_1$ or $v_2$ or $v_i$, respectively, of the light from the three light sources $D_1$ or $D_2$ or $D_i$, respectively, are thus locked with resonant frequencies of the Fabry-Perot resonator R, which are shown in the outline diagram of FIG. 3 and likewise designated there by $v_1$ or $v_2$ or $v_i$, respectively. The number $k_i$ of traversed resonances of the Fabry-Perot resonator R is also indicated in the outline diagram of FIG. 3 by means of an appropriately designated arrow.

The light from the three light sources $D_1$, $D_2$ and $D_i$ circulates in the common light path section $L_{G1}-L_{G4}$. In this case, one beat frequency $\Delta v_{1i}$ or $\Delta v_{2i}$ is respectively formed between the frequency $v_i$ of the light from the further light source $D_i$ and the frequency $v_1$ or $v_2$ of the light from the light source $D_1$ or $D_2$, respectively.

The beat frequency $\Delta v_{1i}$ or $\Delta v_{2i}$ is now calculated on the basis of the following considerations.

During the traversal of resonances in the Fabry-Perot resonator R, the mean value $\bar{v}_i$ of the frequency $v_i$ of the light from the further light source $D_i$ varies between one resonance and the next by in each case a free spectral range FSR. The value of the free spectral range FSR has already been measured in the course of the method, because it is equal to the beat frequency $\Delta v_{12}$ between the frequencies $v_1$ and $v_2$ of the light from the first and second light sources $D_1$ and $D_2$, respectively. Consequently, the beat frequency $\Delta v_{1i}$ or $\Delta v_{2i}$ is equal to the product $(\Delta v_{12} \times k_i)$ or $(\Delta v_{12} \times k_i + 1)$ of the beat frequency $\Delta v_{12}$ and the number $k_i$ of resonances traversed. It holds in this case that $(\Delta v_{12} \times k_i)$ or $(\Delta v_{12} \times k_i + 1)$, depending on whether as it varies the mean value $\bar{v}_i$ sweeps over only one or both of the mean values $\bar{v}_2$ or $\bar{v}_1$, that is to say it holds that $$\Delta v_{1i} = (\Delta v_{12} \times k_i + 1)$$

when, on the occasion that it varies, the mean value $\bar{v}_i$ proceeds from a mean value $\bar{v}_1$ or $\bar{v}_2$ and, as it varies, also temporarily becomes equal to the other mean value $\bar{v}_2$ or $\bar{v}_1$, or $$\Delta v_{1i} = (\Delta v_{12} \times k_i)$$

when, on the occasion that it varies, the mean value $\bar{v}_i$ proceeds from a mean value $\bar{v}_1$ or $\bar{v}_2$ and, as it varies, never becomes equal to the other mean value $\bar{v}_2$ or $\bar{v}_1$.

Finally, coupling the light $L_O$ and/or $L_{O'}$ out of the common light path section $L_{G1}-L_{G4}$ via the semireflecting optical elements $BS_O$ and/or $BS_{O'}$ also provides light with a synthetic wavelength $\Lambda_{1i}$ or $\Lambda_{2i}$ which corresponds to the calculated beat frequency $\Delta v_{1i}$ or $\Delta v_{2i}$, respectively, and is thus based via this calculation on the electronically measured measured frequency value $f_{12}$, and is therefore also known with the appropriate measuring accuracy.

The method steps specified above can be repeated with at least one yet further light source $D_N$ in order to obtain a yet further beat frequency $\Delta v_{1N}$ or $\Delta v_{2N}$ in the light coupled out of the common light path section $L_{G1}-L_{G4}$. This yet further beat frequency $\Delta v_{1N}$ or $\Delta v_{2N}$ is based, in turn, via a calculation on the electronically measured measured frequency value $f_{12}$, and it is therefore, in turn, known with the appropriate measuring accuracy. The corresponding frequency $v_N$ is shown in the outline diagram of FIG. 3 and denoted there likewise by $v_N$. The number $k_N$ of traversed resonances of the Fabry-Perot resonator R is also indicated in the outline diagram of FIG. 3 by means of an appropriately designated arrow.

In the first design example so far described of the multifrequency light source, the Fabry-Perot resonator R is regarded as being inherently stable enough for no special measures to be required for the purposes of the invention in order to stabilize the Fabry-Perot resonator R or its resonance length $L_R$.

In a second design example of the multifrequency light source, which will now be described in more detail in conjunction with FIG. 4, the Fabry-Perot resonator R is not inherently stable, but is designed as a tunable resonator with a settable resonance length $L_R$.

A setting device $E_R$ connected to the Fabry-Perot resonator R is provided for setting $\delta L_R$ of the resonance length $L_R$. For example, the resonance length $L_R$ of the Fabry-Perot resonator R can be varied via a piezoelectric transducer. Such a design is already known, inter alia from the article by R. Dändliker quoted at the beginning.

A further, inherently stable light source $D_R$, serving as reference, is provided for emitting coherent light on an assigned light path $L_R$ at an assigned frequency $v_R$.

In a fashion analogous to the arrangement described in conjunction with the light sources $D_i$ (with i=1 ... N and N≧3), this further light source $D_R$ can also be set and tuned as a function of an electric feed signal $st_R$ fed to it, and its light is coupled into the common light path section $L_{G1}$ by means of a further semireflecting optical element $BS_R$, which is assigned to it and inserted on its light path $L_R$.

Likewise in a fashion analogous to the described arrangement in conjunction with the light sources $D_i$ (with i=1 ... N and N≧3), a further electric controller $ST_R$ is provided which is assigned a characteristic modulation frequency $m_R$ and which is electrically connected to the further light source $D_R$ as well as to the electronic signal discriminator $SD_R$. The controller $SD_R$ generates for the further light source $D_R$ a feed signal $st_R$, which sets the light of this further light source $D_R$ at its frequency $n_R$ as a function of an electric control signal $s_R$ fed to the controller $ST_R$ and modulates this frequency $v_R$ about the mean value $\bar{v}_R$ thereof with the modulation frequency $m_R$. The controller $ST_R$ also generates a signal which carries the modulation frequency $m_R$ and is output to the signal discriminator $SD_R$, and receives the further electric control signal $s_R$ from the signal discriminator $SD_R$.

However, in addition the further electric controller $ST_R$ is electrically connected to the setting device $E_R$ in order to output an electric setting signal $st_E$ to the latter.

A further tracking controller, by means of which the frequency $n_R$ of the light from the further light source $D_R$ can be locked with a resonant frequency of the Fabry-Perot resonator R, is essentially formed by the setting device $E_R$, the further electric controller $ST_R$, the optoelectronic detector $PD_R$ and the signal discriminator $SD_R$. As a result, the Fabry-Perot resonator R can be stabilized with the aid of the further, inherently stable light source $D_R$, serving as reference.

Figure 4:
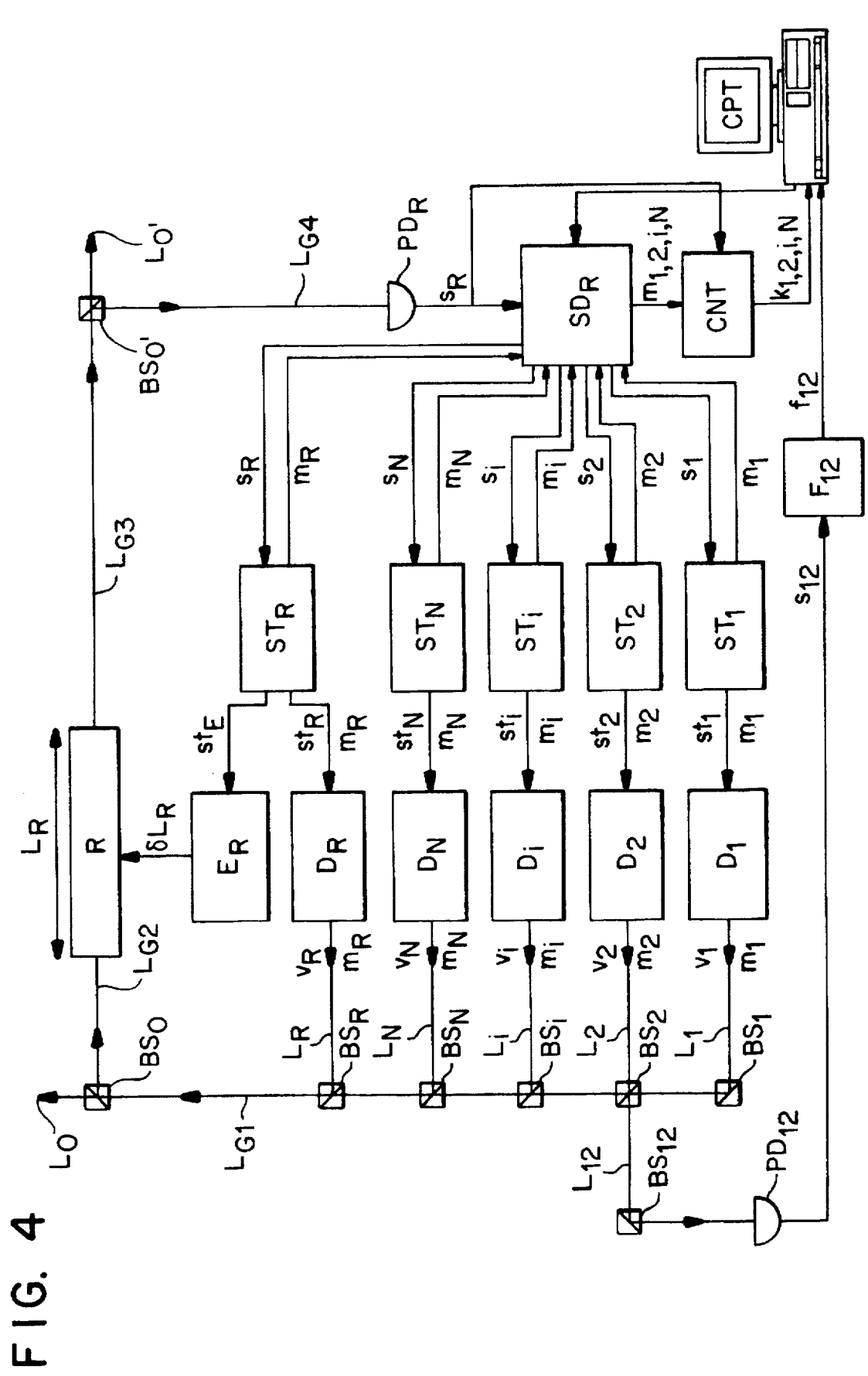
FIG. 4 shows a block diagram of a second design example of a stabilized multi-frequency light source according to the invention.

The inherently stable light source $D_R$, serving as reference, can, as represented in FIG. 4, be a separate light source, and like the individual light sources ($D_i, D_R$) it can be selected from the group formed by tunable laser diodes, tunable dye lasers and tunable solid-state lasers.

Figure 5:
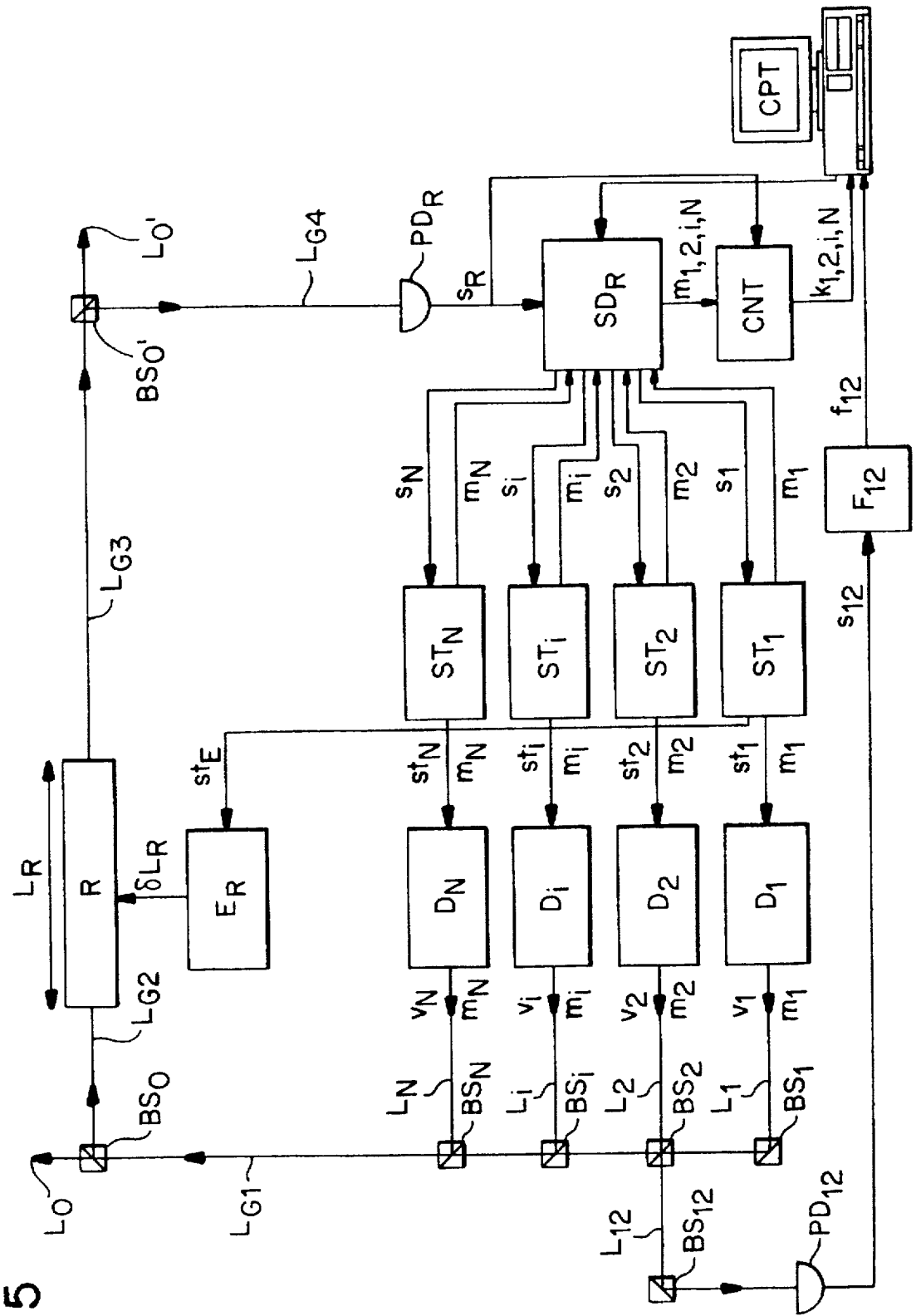
FIG. 5 shows a block diagram of a third design example of a stabilized multi-frequency light source according to the invention.

However, as represented in FIG. 5, one of the two selected light sources $D_1$ or $D_2$ can serve as reference and stable light source. FIG. 5 is designed on the example of the light source $D_1$ and can be derived from FIG. 4 by virtue of the fact that the controller $ST_R$ becomes congruent with the controller $ST_1$, and the light source $D_R$ becomes congruent with the light source $D_1$, the connection to the setting device $E_R$ emerging now from the controller $ST_1$. An analogous drawing could be drawn up on the example of the light source $D_2$.

The method is carried out optimally when the number $k_i$ or $k_i+1$ of resonance traversed during the variation of the mean value $\bar{v}_i$ of the frequency $v_i$ is approximately equal to the finesse F of the Fabry-Perot resonator R, because this number $k_i$ or $k_i+1$ then essentially has the highest value for which the measuring accuracy of the accumulating system-induced measuring errors is still not yet essentially reduced.

In one example of application of the invention, a distance is measured. Using three light sources $D_1$, $D_2$, $D_3$, two synthetic wavelengths $\Lambda_{12}$ or $\Lambda_{13}$ are formed in accordance with the beat frequencies $\Delta v_{12}$ and $\Delta v_{13}$, respectively. The first beat frequency $\Delta v_{12}$ corresponds to the free spectral range FSR of the Fabry-Perot resonator R; it is at approximately 1.5 GHz and its electronically measured frequency is known with a relative measuring accuracy of $10^{-6}$. The free spectral range FSR yields a resonance length $L_R$ of approximately 50 mm for a confocal Fabry-Perot resonator R. The second beat frequency $\Delta v_{13}$ is selected such that it is in the range from 100 to 300 GHz; 60 to 200 resonances of the Fabry-Perot resonator R are thus traversed when it is formed. Said resonator is then to have a finesse of 100 or more so that its resonances can be effectively distinguished from one another. The distance measurement is performed at the two beat frequencies $\Delta v_{12}$ and $\Delta v_{13}$, which permits the measurement uncertainty which occurs at each individual beat frequency to be rectified by a whole number of wavelengths. It would also have been possible to achieve an equivalent result by using the beat frequency $\Delta v_{23}$. If the device is designed with a stabilization of the Fabry-Perot resonator R on the basis of a stabilized light source $D_1$ which, for its part, is locked in a known way with the resonance of a rubidium vapor cell, the estimated uncertainty of the frequency $v_1$ of the light source $D_1$ is approximately ±50 MHz, with the result that the estimated relative uncertainty of the length of the Fabry-Perot resonator R, and thus also of the free spectral range FSR and of the beat frequencies is approximately $10^{-7}$ or 0.1 ppm.

We claim:

1. A stabilized multi-frequency light source for generating synthetic light wavelengths, having at least three light sources ($D_i$ with i=1 ... N and N≧3) for emitting coherent light, on an assigned light path ($L_i$) in each case, at an assigned frequency ($v_i$) which can be set and tuned as a function of an electric feed signal ($st_i$) fed to the light source ($D_i$), a common light path section ($L_{G1}, L_{G2}, L_{G3}, L_{G4}$) on which is a Fabry-Perot resonator (R) with a resonance length ($L_R$) suitable for resonance at said frequencies ($v_i$), semireflecting optical elements ($BS_i$), which are assigned to one light source ($D_i$) each and are used on the light path ($L_i$) thereof in order to couple the light thereof into the common light path section ($L_{G1}$), electric controllers ($ST_i$), to which one characteristic modulation frequency ($m_i$) each is assigned and which are electrically connected to an individual assigned light source ($D_i$) each and generate for the latter in each case a feed signal ($st_i$) which sets the frequency ($v_i$) of the light from this light source ($D_i$) as a function of an electric control signal ($s_i$) fed to the controller ($ST_i$) and modulates this frequency ($v_i$) about the mean value ( $\bar{v}_i$) thereof with the modulation frequency ($m_i$), an optoelectronic detector ($PD_R$) for receiving light circulating in the common light path section ($L_{G4}$) and for generating an electric detector signal ($s_R$) as a function of an intensity of the light thus received, an electronic signal discriminator ($SD_R$) which is electrically connected to the detector ($PD_R$) and the controllers ($ST_i$) in order to receive the detector signal ($s_R$) from the detector ($PD_R$) and a signal from each controller ($ST_i$) carrying the respective modulation frequency ($m_i$), and which generates from the signals thus obtained by means of synchronous demodulation of the detector signal ($s_R$) with the respective modulation frequency ($m_i$) the respective control signal ($s_i$) for the respective controller ($ST_i$) and outputs it to this controller ($ST_i$).

the electric controller ($ST_i$) corresponding to a light source ($D_i$), the optoelectronic detector ($PD_R$) and the signal discriminator ($SD_R$) forming a tracking controller for locking the frequency ($v_i$) of the light from this light source ($D_i$) with a resonant frequency of the Fabry-Perot resonator (R), wherein an element ($BS_2$) selected from the semireflecting optical elements ($BS_i$) is arranged such that it combines light from only two selected light sources ($D_1, D_2$) and couples a portion of this combined light out of the assigned light paths ($L_1, L_2$) and directs it to a branching light path ($L_{12}$).

a second optoelectronic detector ($PD_{12}$) is provided for receiving the light circulating on the branching light path ($L_{12}$) and for generating a second electric detector signal ($s_{12}$) as a function of an intensity of the light thus received, and an electronic frequency measuring device ($F_{12}$) is provided which is electrically connected to the second detector ($PD_{12}$) in order to receive the second detector signal ($s_{12}$) from the latter and to generate therefrom an electric measured frequency value ($f_{12}$) which can be fed to an evaluation device (CPT), the measured frequency value ($f_{12}$) corresponding to a beat frequency ($\Delta v_{12}$) between the frequencies ($v_1, v_2$) of the light of the selected two light sources ($D_1, D_2$).

2. A stabilized multi-frequency light source as claimed in claim 1, in which the Fabry-Perot resonator (R) is constructed as a tunable resonator with a settable resonance length ($L_R$), and a setting device ($E_R$) connected to the Fabry-Perot resonator (R) is provided for setting ($\delta L_R$) the resonance length ($L_R$) thereof, defined by a further, inherently stable, light source ($D_R$), serving as reference, for emitting coherent light on an assigned light path ($L_R$) at an assigned frequency ($v_R$) which can be set and tuned as a function of an electric feed signal ($st_R$) fed to this further light source ($D_R$), a further semireflecting optical element ($BS_R$), which is assigned to the further light source ($D_R$) and is used on the light path ($L_R$) thereof in order to couple the light thereof into the common light path section ($L_{G1}$), and a further electric controller ($ST_R$), which is assigned a characteristic modulation frequency ($m_R$) and which is electrically connected to the setting device ($E_R$), the further light source ($D_R$) and the electronic signal discriminator ($SD_R$) in order to generate for the further light source ($D_R$) a feed signal ($st_R$), which sets the frequency ($v_R$) of the light from this further light source ($D_R$) as a function of an electric control signal ($s_R$) fed to the controller ($ST_R$) and modulates this frequency ($v_R$) about the mean value ($\bar v_R$) thereof with the modulation frequency ($m_R$), in order to generate a signal carrying the modulation frequency ($m_R$) and output it to the signal discriminator ($SD_R$), to receive the further electric control signal ($s_R$) from the signal discriminator ($SD_R$), and to output an electric setting signal ($st_E$) to the setting device ($E_R$), the setting device ($E_R$), the further electric controller ($ST_R$), the optoelectronic detector ($PD_R$) and the signal discriminator ($SD_R$) essentially forming a further tracking controller for locking the resonance length ($L_R$) of the Fabry-Perot resonator (R) with the frequency ($v_R$) of the light from the further light source ($D_R$).

3. The stabilized multi-frequency light source as claimed in claim 2, wherein one of the selected two light sources ($D_1, D_2$) is provided as a further, inherently stable, light source ($D_R$) serving as reference.

4. A stabilized multi-frequency light source as claimed in claim 1, wherein the individual light sources ($D_i, D_R$) is selected independently of one another from the group formed by tunable laser diodes, tunable dyelasers and tunable solid-state lasers.

5. A stabilized multi-frequency light source as claimed in claim 1, defined by an electronic counting device (CNT) for counting a number ($k_i$) of resonances of the light from a light source ($D_i$) with the resonance length ($L_R$) of the Fabry-Perot resonator (R) at the mean value ($\bar v_i$) of the frequency ($v_i$) of this light during a change in this mean value ($\bar v_i$), the counting device (CNT) being electrically connected to the detector ($PD_R$) and the signal discriminator ($SD_R$), in order to receive the detector signal ($s_R$) from the detector ($PD_R$) and to receive a signal carrying the respective modulation frequency ($m_i$) from the signal discriminator ($SD_R$), and, by means of synchronous demodulation of the detector signal ($s_R$) with the respective modulation frequency ($m_i$) forming from the signals thus received a resulting demodulated signal and counting the peak values thereof, in order to generate the count value of the number ($k_i$) of traversed resonances.

6. A stabilized multi-frequency light source as claimed in claim 5, wherein the electronic counting device (CNT) is electrically connected to the evaluation device (CPT), in order to feed the latter the count value of the number ($k_i$) of traversed resonances.

7. A method for generating synthetic light wavelengths by means of the stabilized multi-frequency light source as claimed in claim 1, defined by the following method steps:

coupling the light of a first light source ($D_1$) of frequency ($v_1$) into the common light path section ($L_{G1}$), locking the mean value ($\bar v_1$) of the frequency ($v_1$) of the light from the first light source ($D_1$) with a first resonant frequency ($v_1$) of the Fabry-Perot resonator (R), coupling the light from a second light source ($D_2$) of frequency ($v_2$) into the common light path section ($L_{G1}$), setting the mean value ($\bar v_2$) of the frequency ($v_2$) of the light from the second light source ($D_2$) in order to achieve a second resonant frequency ($v_2$), immediately following the first one, of the Fabry-Perot resonator (R), locking the mean value ($\bar v_2$) of the frequency ($v_2$) of the light from the second light source ($D_2$) with a second resonant frequency ($v_2$) of the Fabry-Perot resonator (R), forming a beat frequency ($\Delta v_{12}$) between the frequencies ($v_1, v_2$) of the light from the first and second light sources ($D_1, D_2$) in the common light path section ($L_{G1} - L_{G4}$).

measuring the beat frequency ($\Delta v_{12}$) with the aid of electronic counting means in conjunction with the provision of a corresponding measured frequency value ($f_{12}$), coupling out light ($L_O, L_{O'}$) out of the common optical path section ($L_{G1}$–$L_{G4}$) for use as light with a synthetic wavelength which corresponds to the beat frequency ($\Delta v_{12}$), which for its part is known via the electronically measured frequency value ($f_{12}$), coupling a light from at least one further light source ($D_i$) of frequency ($v_i$) into the common optical path section ($L_{G1}$), setting the mean value ($\bar{v}_i$) of the frequency ($v_i$) of the light from the further light source ($D_i$) until it matches the mean value ($\bar{v}_1$ or $\bar{v}_2$) of the frequency ($v_1$ or $v_2$) of the light from one of the abovementioned first and second light sources ($D_1, D_2$), varying the mean value ($\bar{v}_i$) of the frequency ($v_i$) of the light from the further light source ($D_i$) for traversing resonances of the Fabry-Perot resonator (R) in conjunction with counting the number ($k_i$) of traversed resonances until achieving a predetermined number ($k_i$) of resonances and a corresponding resonant frequency ($v_i$), locking the mean value ($\bar{v}_i$) of the frequency ($v_i$) of the light from the further light source ($D_i$) with the resonant frequency ($v_i$) of the Fabry-Perot resonator (R) which is reached, calculating a beat frequency ($\Delta v_{1i}$ or $\Delta v_{2i}$) between the frequency ($v_1$ or $v_2$) of the light from the first or second light source ($D_1$ or $D_2$) and the frequency ($v_i$) of the light from the further light source ($D_i$) in the common optical path section ($L_{G1}$–$L_{G4}$) as a product ($k_i \times \Delta v_{12}$ or $k_i+1 \times \Delta v_{12}$) of the beat frequency ($\Delta v_{12}$) between the frequencies ($v_1, v_2$) of the light from the first and second light sources ($D_1, D_2$) essentially with the number ($k_i$ or $k_i+1$) of traversed resonances, and coupling light ($L_O, L_{O'}$) out of the common optical path section ($L_{G1}$–$L_{G4}$) for use as light with a synthetic wavelength which corresponds to the calculated beat frequency ($\Delta v_{1i}$ or $\Delta v_{2i}$).

8. The method as claimed in claim 7, defined by the repetition, with at least yet one further light source ($D_N$), of the method steps of coupling in the light from the further light source, setting and thereupon varying the light frequency in conjunction with counting the number ($k_N$ or $k_N+1$) of traversed resonances, subsequently locking the mean value ($\bar{v}_N$) of the frequency ($v_N$) of the light from the yet further light source ($D_N$) with the resonant frequency ($v_N$) of the Fabry-Perot resonator (R) which has been reached, calculating the beat frequency ($\Delta v_{1N}$ or $\Delta v_{2N}$), and coupling the light out of the common optical path section ($L_{G1}$–$L_{G4}$) for use as light with a synthetic wavelength which corresponds to the calculated beat frequency ($\Delta v_{1N}$ or $\Delta v_{2N}$).

9. The method as claimed in claim 7, defined by the stabilization of the Fabry-Perot resonator (R) by locking the latter with coherent light from a further, inherently stable, light source ($D_R$ or $D_1$ or $D_2$) serving as reference.

10. The method as claimed in claim 7, wherein the number ($k_i$ or $k_i+1$) of resonances traversed during the variation of the mean value ($\bar{v}_i$) of the frequency ($v_i$) is approximately equal to a finesse (F) of the Fabry-Perot resonator (R).

* * * * *